(12) United States Patent
Frank

(10) Patent No.: US 7,485,815 B2
(45) Date of Patent: Feb. 3, 2009

(54) MOUNTING DEVICE FOR A CAPACITOR

(75) Inventor: Bernhard Frank, Krefeld (DE)

(73) Assignee: AIC Europe Elektronische Bauteile GmbH, Krefeld (DE)

( * ) Notice: Subject to any disclaimer, the term of this patent is extended or adjusted under 35 U.S.C. 154(b) by 99 days.

(21) Appl. No.: 11/444,925

(22) Filed: Jun. 1, 2006

(65) Prior Publication Data

US 2006/0275996 A1    Dec. 7, 2006

(30) Foreign Application Priority Data

Jun. 2, 2005    (DE) .................. 10 2005 025 832

(51) Int. Cl.
*H05K 7/14* (2006.01)
(52) U.S. Cl. .................. 174/535; 174/547; 174/548; 361/809; 361/811
(58) Field of Classification Search .......... 174/535, 174/547, 548; 361/807, 809, 811
See application file for complete search history.

(56) References Cited

U.S. PATENT DOCUMENTS

| | | | | |
|---|---|---|---|---|
| 5,717,386 | A * | 2/1998 | Sakagami et al. | 340/3.1 |
| 6,025,556 | A * | 2/2000 | Yoshimura et al. | 174/524 |
| 6,262,360 | B1  | 7/2001 | Michel | |
| 6,262,367 | B1 * | 7/2001 | Correa | 174/535 |
| 6,510,060 | B2 * | 1/2003 | Jakob et al. | 361/807 |
| 6,768,056 | B2  | 7/2004 | Fischer et al. | |
| 7,044,428 | B2  | 5/2006 | Michel et al. | |

FOREIGN PATENT DOCUMENTS

| | | |
|---|---|---|
| DE | 38 43 652 | 6/1990 |
| DE | 39 19 483 | 12/1990 |
| DE | 40 38 689 | 6/1992 |
| DE | 196 42 462 | 4/1998 |
| DE | 197 25 843 | 10/1998 |
| DE | 100 16 864 | 11/2001 |
| EP | 1 515 596 | 3/2005 |
| JP | 06236825 | 8/1994 |
| JP | 08-64457 | 3/1996 |
| JP | 09074042 | 3/1997 |

OTHER PUBLICATIONS

Search Report dated Sep. 21, 2006 issued for European Application No. 06 11 4092.

* cited by examiner

*Primary Examiner*—Hung V Ngo
(74) *Attorney, Agent, or Firm*—Cohen Pontani Lieberman & Pavane LLP

(57) ABSTRACT

A mounting device for mounting a capacitor on a connector element includes a hollow body defining a continuous through-hole that axially penetrates the body for receiving and mounting the capacitor. The body has a lower region defining a lower through-hole portion with a dimension. The body further has a middle region defining a middle through-hole portion with a dimension that is smaller than the first through-hole dimension. Therefore, the middle region and the lower region define a first inner shoulder between them. The body further has an upper region defining an upper through-hole portion with a dimension that is smaller than the second through-hole dimension. The upper region and the middle region define a second inner between them.

17 Claims, 4 Drawing Sheets

MOUNTING DEVICE FOR A CAPACITOR

BACKGROUND OF THE INVENTION

1. Field of the Invention

The present invention relates to a mounting device having a hollow body with a continuous through-hole that axially penetrates the body for mounting a capacitor on a connector element, and to a mount-capacitor assembly including such a mounting device and an electrolytic capacitor inserted in the mounting device, the capacitor having a cup with a cup bottom and a circumferential outer insulation.

2. Description of the Related Art

Mounting devices and assemblies of this type are used in many systems in which electrolytic capacitors are mounted on connector elements both vertically and horizontally.

Various capacitors and mount-capacitor assemblies are known.

DE 39 19 483 A1 and DE 38 43 652 A1 disclose basic embodiments of electrolytic capacitors. In the previously known electrolytic capacitor, the cup and the aluminum cover are welded gastight by a laser weld that extends over the outer circumference of the unit formed by the cup cover.

U.S. Pat. No. 6,768,056 B2 discloses an electrolytic capacitor with a housing with an electrically conductive cup, which has a wall and a bottom, and with an electrically insulating envelope that covers the outside of the cup and has an opening at the bottom of the cup. The opening is smaller than the bottom of the cup. The housing also includes a fill element that is a good thermal conductor and is arranged inside the opening, and a cover element that is electrically insulating covers the bottom of the cup and overlaps the envelope. In addition, the patent discloses an electrolytic capacitor with a round coil and the housing as well as a housing assembly or an assembly of an electrolytic capacitor. Improved heat conduction of the housing with reduced production cost for the cup can be realized by the use of a flat cup bottom in conjunction with a fill element and a cover element.

DE 196 42 462 A1 discloses other forms of electrolytic capacitors with a cup which provide effective dissipation of heat produced during operation. This is achieved by virtue of the fact that the bottom of the cup, which is covered with a heat-conducting plate, is pressed against the chassis or the capacitor support. This is ensured by the fact that the heat-shrinkable sleeve ends at the recess just above the bottom of the cup. The intimate contact with the heat sink is achieved by a pressing force produced by screw connection of screw collar rings with the capacitor support.

A disadvantage of the above mentioned examples is their inadequate mounting on possible connector elements, since, for example, only a screw collar ring is provided, which does not satisfy requirements with respect to stability when mounted on a vertical wall, from which the capacitor projects horizontally. Moreover, some of the above cited non-standard capacitors are expensive to produce.

In addition, known mounting devices do not provide a self-centering of the capacitor, so that they can be aligned and centered only with difficulty in locations which are difficult to access.

SUMMARY OF THE INVENTION

It is an object of the present invention to overcome the aforementioned disadvantages and to create a mounting device that securely and reliably holds a capacitor, ensures stable and reliable installation or mounting of the capacitor on a possible connector element, and, in addition, allows self-centering of the capacitor.

A further object is to create a mount-capacitor assembly where the capacitor can be securely and reliably fastened to a connector element, and sufficient contact pressure between the mounting device and the capacitor, respectively, and the connector element is guaranteed.

According to the invention, a mounting device, especially for an aluminum electrolytic capacitor, includes a hollow body defining a continuous through-hole that axially penetrates the body for receiving and mounting the capacitor. The body includes a lower region designed to receive fastening means for connecting the body to the connector element, and defining a lower through-hole portion with a dimension; a middle region defining a middle through-hole portion with a dimension that is smaller than the lower through-hole dimension, the middle region and the lower region thus defining a first inner shoulder between them, and an upper region defining an upper through-hole portion with a dimension that is smaller than the middle through-hole dimension, the upper region and the middle region thus defining a second inner shoulder between them.

An advantage of this embodiment is that the mounting device has several regions, which are suitable for allowing self-centering during the assembly of the capacitor to be mounted. The capacitor can be reliably, securely, and stably mounted as a result of the various shoulders, which serve as stops.

Each of the regions preferably has an essentially ring-shaped design. Since a capacitor also has an essentially cylindrical design, this allows secure mounting of the capacitor. The ring-shaped design ensures simple production.

It is also preferred that the cross sections of the through-hole are circular. The circular cross sections are simple to produce and allow simple use with capacitors that are cylindrical in cross section.

Furthermore, it is preferred that the third upper region has a thinner wall thickness to provide resilience. This resilience allows self-adjustment of the capacitor when it is mounted in the mounting device if suitable tolerances are used.

It is also preferred that the upper region has recesses formed along its periphery to form resilient tongues. The tongues result in a better elastic effect, so that the tolerances can be more narrowly dimensioned and yet self-adjustment still realized. In addition, weight savings are realized.

In addition, it is preferred that the mounting device is made of a sufficiently stable material selected from the group of plastics including PBT (polybutylene terephthalate). This material offers sufficient stability at a low weight, is weather-resistant, and is suitable for being used as a mount in various applications.

According to a preferred embodiment of the invention, a mount-capacitor assembly includes a capacitor with a cup having a cup bottom, and with a circumferential outer insulation; and a mounting device including a hollow body defining a continuous through-hole that axially penetrates the body for receiving and mounting the capacitor. The body includes a lower region having means for fastening the body to the connector element, and defining a lower through-hole portion with a dimension; a middle region defining a middle through-hole portion with a dimension that is smaller than the lower through-hole dimension, the middle region and the lower region thus defining a first inner shoulder between them, and an upper region defining an upper through-hole portion with a dimension that is smaller than the middle through-hole dimension, the upper region and the middle region thus defining a second inner shoulder between them.

This mounting device guarantees secure, reliable mounting of the capacitor in various applications and directions. Especially in the case of vertical walls, from which the capacitor then projects horizontally, optimum mounting is realized, which, in addition, is self-adjusting during assembly.

The cup bottom is preferably planar. This makes it possible to use capacitors that are simple to produce, especially standard capacitors. There is no need for the special production of capacitors that require specially produced regions for installation in mountings.

It is also preferred that the outer insulation ends essentially flush with the bottom of the cup. In this way, there is no need for recesses to be formed in the capacitor so as to at least partially arrange the outer insulation in this recess. This makes it easier to produce the outer insulation.

In a preferred embodiment, the capacitor has an at least partial circumferential radial projection that abuts against the first inner shoulder to realize a stop while assembling the mount-capacitor assembly. This stop makes it possible to adjust the contact pressure that is necessary when the mounting device with the inserted capacitor is mounted on a connector element.

In addition, it is preferred that the capacitor has an at least partial circumferential radial projection that interacts with the second inner shoulder to realize centering during the assembly of mounting device and capacitor. Simple self-adjustment can be realized by means of this projection on the capacitor. Both radial projections may be formed as shoulders on the capacitor, preferably as shoulders on an insulating sleeve which is fitted to a cylindrical capacitor.

A connector element can be connected to the mounting device, wherein a plate is sandwiched between the bottom of the cup and the connector element, which plate is designed to guarantee a sufficient creepage distance. This ensures that unwanted creepage of an electric current does not occur in any direction, for example, between the capacitor and the mounting device or between the capacitor and the connector element.

This has the advantage, that, first, the plate guarantees a sufficient creepage distance to allow safe functioning of the capacitor and, second, the plate realizes sufficient heat dissipation. Sufficient heat dissipation ensures that the maximum temperature the capacitor can withstand is not exceeded.

Therefore, it is additionally preferred that the plate be made of metal to realize suitable heat dissipation. This prevents functional impairment by, for example, overheating of the capacitor.

It is also preferred that the plate covers the entire contact surface between the bottom of the cup and the connector element and/or the mounting device and the connector element. A large contact surface can be realized especially by virtue of the lack of a recess or gradation of the bottom surface of the capacitor or the bottom of the cup. It is advantageous for the entire contact surface to be used for heat dissipation.

In addition, the plate will have a suitable thickness of approximately $\geq 10$ mm to $\leq 16$ mm, preferably $\geq 11$ mm to $\leq 15$ mm, more preferably $\geq 12$ mm to $\leq 14$ mm, and most preferably $\geq 12.7$ mm to $\leq 13.0$ mm, in order to guarantee a sufficient creepage distance. With these ranges, the plate has sufficiently small dimensions to guarantee both a sufficient creepage distance in accordance with industrial standards and sufficient heat dissipation. In addition, the plate is quite compact.

It is additionally preferred that the connector element is a heat sink, for example a cooling body or a cooling plate. This active cooling makes it possible to keep the capacitor within an optimum range of operating temperatures, so that optimum functioning is guaranteed.

It is also preferred that the first lower region of the mounting device is designed to receive fastening means that interact with the connector element in order to realize sufficient contact pressure when the connector element, the plate, and the mounting device with inserted capacitor are joined to form the mount-capacitor assembly. This makes it possible to realize optimum mounting of the capacitor, even on vertical walls. Furthermore, before the connector element, the plate, and the mounting device with the inserted capacitor are connected, the bottom of the cup preferably stands out from the mounting device with some clearance in order to realize sufficiently high contact pressure between the capacitor and the connector element.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
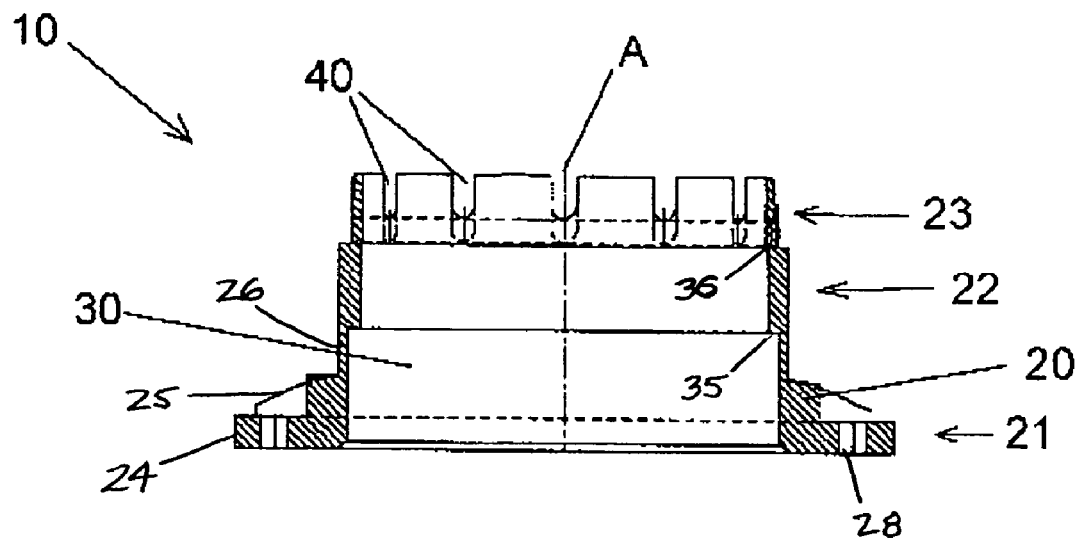
FIG. 1 is a cross-sectional side view of a mounting device.

FIG. 1 shows a cross-sectional side view of a mounting device 10. The mounting device 10 has an essentially ring-shaped design with a hollow body 20 defining a through-hole 30 that penetrates the body 20 along a longitudinal axis A. The through-hole 30 is formed by several adjoining cylindrical through-hole portions having different diameters. Accordingly, the body 20 has a corresponding number of regions. In the preferred embodiment of FIG. 1, the body 20 has three regions, a lower region 21, a middle region 22, and an upper region 23. The lower through-hole portion in the lower region 21 has the largest diameter of all through-hole portions. This diameter is somewhat larger than the outside diameter of a capacitor, so that the capacitor can be mounted in the mounting device 10 with some clearance. The lower region 21 has a base 24. Through-holes 28 are provided for fastening to the connector element 60 by means of, for example, screws 70 or other fastening elements. A reinforcing portion 25 of the lower region 21 has a wall thickness decreasing in the direction of the middle region 22.

In the middle region 22, the body 20 has the same outside diameter as that of the adjacent portion of lower region 21. However, the diameter of the through-hole portion in the middle region 22 is smaller than that in the lower region 21, so that a first inner shoulder 35 is formed on the inside at the transition point. The diameter of the through-hole portion in the middle region 22 is approximately the same as the diameter of the capacitor C and allows for secure mounting of same. The middle region 22 is followed by the upper region 23, which has axial recesses 40 arranged along its circumference, so that tongues are formed. The wall thickness is smaller than in the middle region 22, and the inside diameter of the upper region 23 is again smaller compared to the middle and lower regions. The inside diameter of the upper region 23 is dimensioned in such a way that there is no clearance between the capacitor C and the inside wall of the upper region 23. Due to the fact that the wall is thinner and to the fact that tongues are formed, a springy, elastic upper region 23 is formed, which receives and self-centers the capacitor C. Due to the inside diameters of the middle and upper regions 22 and 23, a second inner shoulder 36 is formed.

Figure 2:
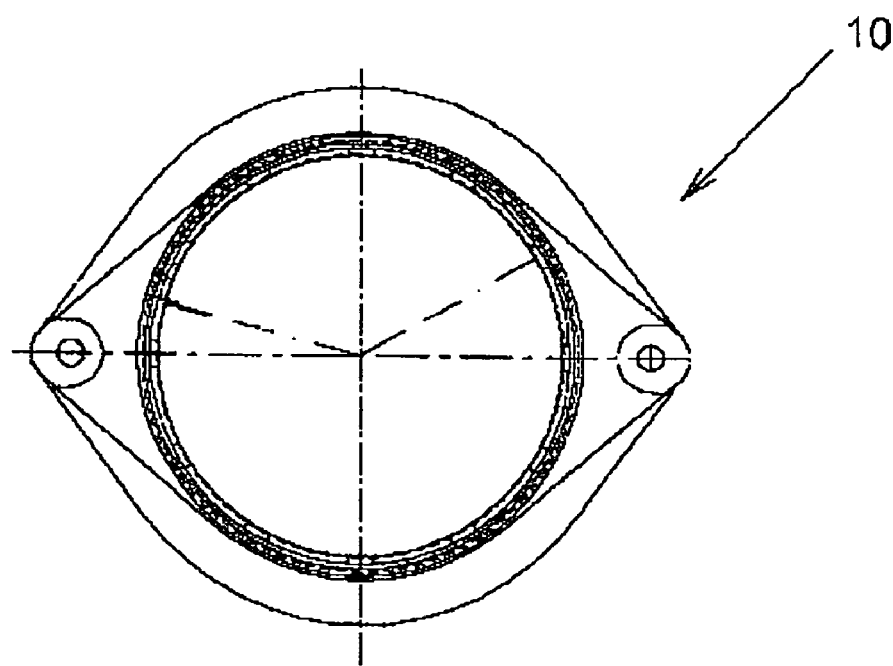
FIG. 2 is a top view of the mounting device of FIG. 1.

FIG. 2 shows a top view of the mounting device of FIG. 1. It is clear from FIG. 2 that the base area of the mounting device 10, i.e., the contact area between the mounting device 10 and the connector element 60 at the base 24 of the lower region 21, has a more or less almond-shaped cross section, merging into a cylindrical or ring-shaped cross section in the axially upward direction towards the upper region 23. The mounting device 10 becomes thinner as a whole from the bottom to the top, i.e., from the lower region 21 to the upper region 23. The outer wall portion 25 of the lower region 21 of the body 20 forms a reinforcement for the connection of the mounting device 10 with the connector element 60.

Figure 3:
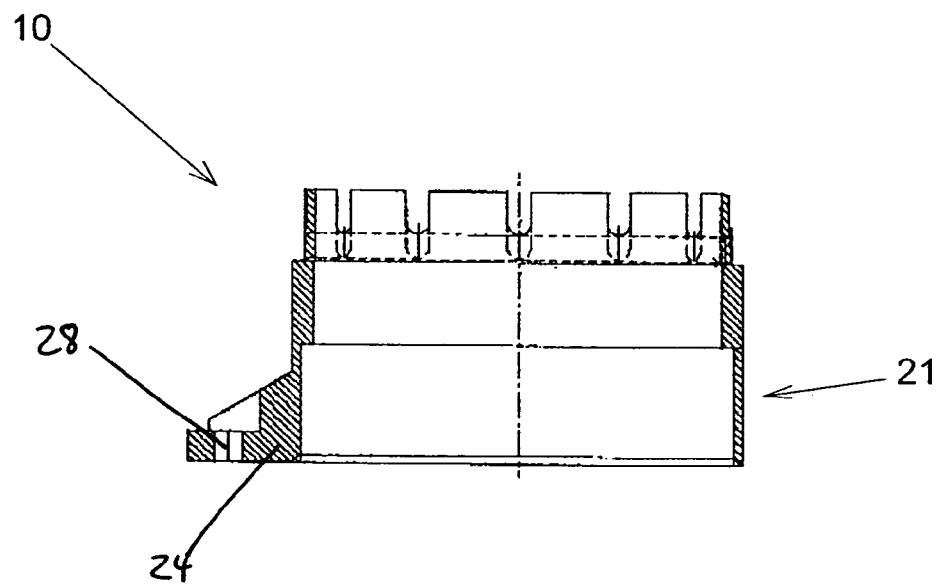
FIG. 3 is a cross-sectional side view of another embodiment of a mounting device.
Figure 4:
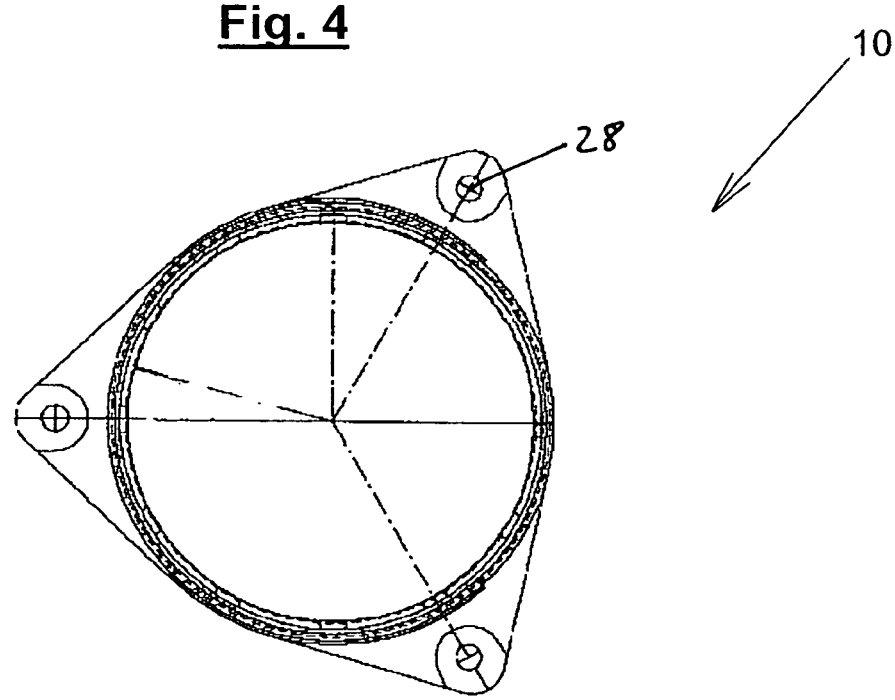
FIG. 4 is a top view of the mounting device of FIG. 3.

FIGS. 3 and 4 show another embodiment of the mounting device 10. The mounting device of FIGS. 3 and 4 has basically the same structure as the mounting device of FIG. 1. The difference is that the base area, i.e., base 24 of the lower region 21, has a different design. There are three instead of two through-holes 28 for connecting the mounting device 10 with the connector element 60, and thus the base area has a different cross section. The base 24 has a rounded triangular design and a through-hole 28 at each of the vertices of the triangle.

Figure 5:
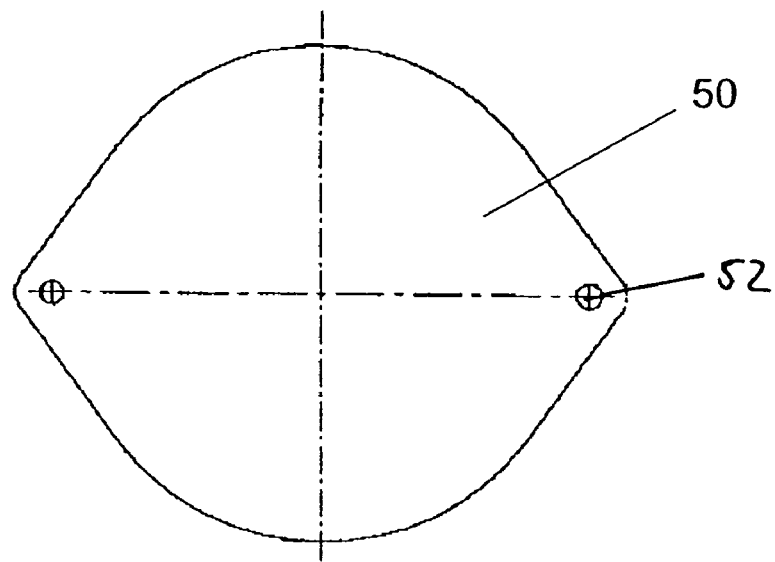
FIG. 5 is a top view of a plate that is part of the mounting device of FIGS. 1 and 2.
Figure 7:
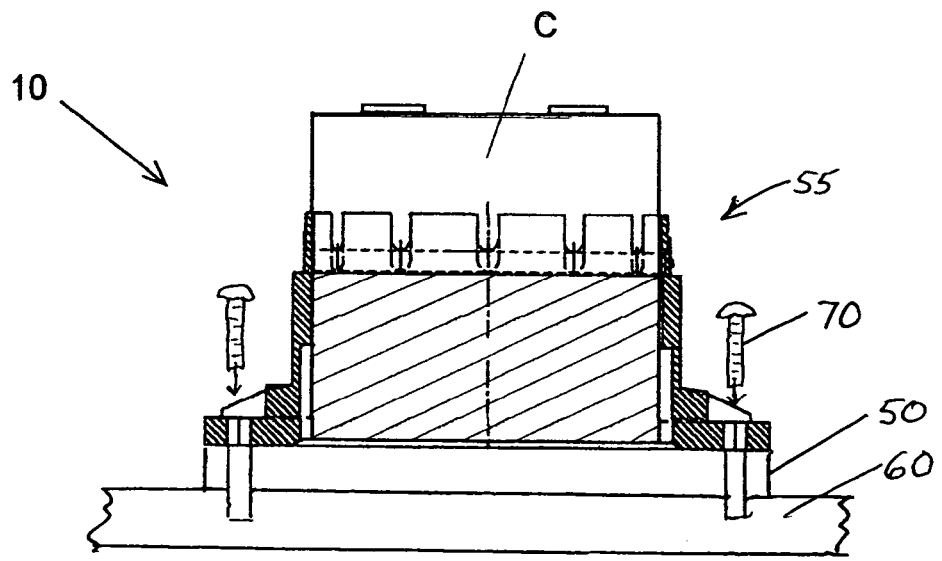
FIG. 7 is a partly cross-sectional side view of a mount-capacitor assembly.

The top view of FIG. 5 shows a plate 50 that is part of the mount-capacitor assembly 55 shown in FIG. 7. The plate 50 has the same outline as the lower wall portion 24 or base area of the mounting device 10 of FIGS. 1 and 2 and has a through-hole 52 at each of its tapering ends. The plate 50, which is to be located between the connector element 60 and the mounting device 10, can thus be connected with the connector element 60 and the mounting device 10 through a contact pressure generated by the fastening means.

Figure 6:
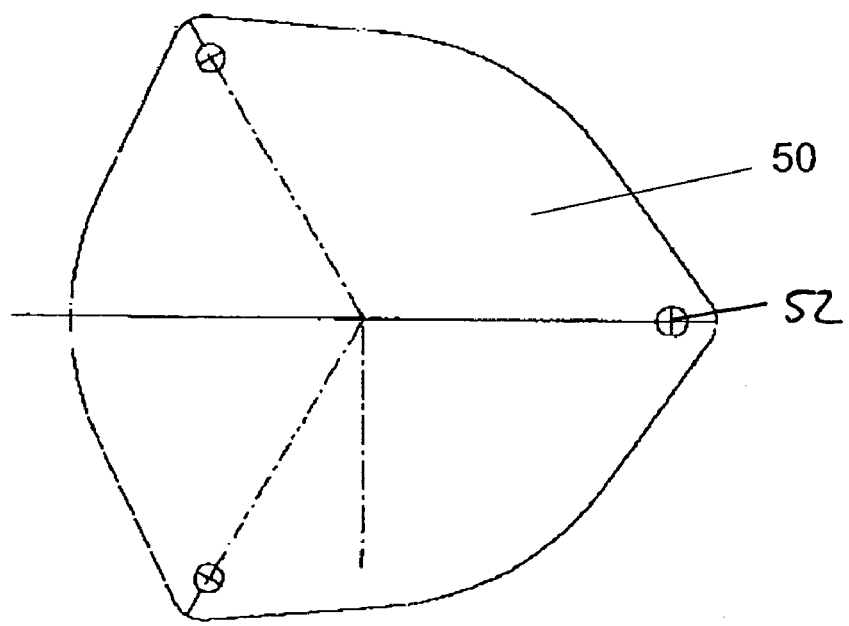
FIG. 6 is a top view of a plate for the mounting device of FIGS. 3 and 4.

FIG. 6 shows a top view of a plate 50 that corresponds to the mounting device 10 shown in FIGS. 3 and 4. Again, this plate 50 has the same outline as the base 24 of the lower region 21 in FIGS. 3 and 4, with a through-hole 52 positioned at each vertex of the triangle.

FIG. 7 shows a mount-capacitor assembly in a side view and partly in a cross sectional view. A capacitor C is centrally arranged in the mounting device 10. The mounting device 10 is connected to the connector element 60 by means of screws 70 or other fastening elements. The plate 50 is arranged between the connector element 60 and the bottom surfaces of the capacitor C and the mounting device 10. In a preferred embodiment, the plate 50 has a thickness of $\geq 10$ mm to $\leq 16$ mm, preferably $\geq 11$ mm to $\leq 15$ mm, more preferably $\geq 12$ mm to $\leq 14$ mm, and most preferably $\geq 12.7$ mm to $\leq 13$ mm, in order to ensure a sufficient creepage distance. It is further designed to realize suitable heat dissipation. The connector element 60 can be designed as a heat sink known per se.

Figure 8:
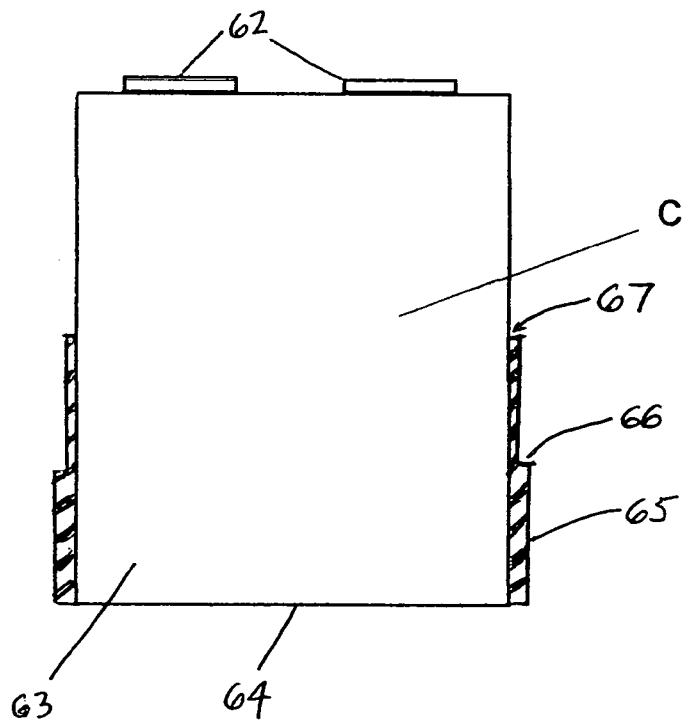
FIG. 8 is a side view of the capacitor of FIG. 7.

The capacitor C can be a common capacitor known per se, for example an aluminum electrolytic capacitor. Alternatively, FIG. 8 shows a preferred embodiment of the capacitor C in a side view. The capacitor C has a substantially cylindrical form. At the top of the capacitor C two contacts 62 are arranged, preferably a plus pole and a minus pole for electrical connection. The capacitor C includes a cup 63 with a planar cup bottom 64 which is essentially flush with a circumferential insulation 65. The capacitor C has an at least partial circumferential radial projection 66 that abuts against the first inner shoulder 35 of the body 20. The capacitor C also has an at least partial circumferential radial projection 67 that interacts with the second inner shoulder 36 of the body 20 to realize centering of the capacitor C in the mounting device 10. The projections 66, 67 may be formed as shoulders on the capacitor or on an insulating sleeve 65 which is fitted on the outside of the capacitor.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A mounting device for mounting a cylindrical capacitor on a connector element, comprising:
    a hollow body defining a continuous through-hole that axially penetrates the body for receiving and mounting the capacitor, the body comprising
    a lower region having means for fastening the body to the connector element, and defining a lower through-hole portion having a cylindrical inside surface with a diameter;
    a middle region defining a middle through-hole portion having a cylindrical inside surface with a diameter that is smaller than the diameter of the lower through-hole portion, the cylindrical inside surfaces of the middle region and the lower region being bounded by a first inner shoulder between them; and
    an upper region defining an upper through-hole portion having a cylindrical inside surface with a diameter that is smaller than the diameter of the middle through-hole portion, the cylindrical inside surfaces of the upper region and the middle region being bounded by a second inner shoulder between them, the upper region having a wall thickness which provides resilience, and the upper region having recesses formed along a periphery thereof to form resilient tongues.

2. The mounting device of claim 1, wherein each of the body regions has an essentially ring-shaped design.

3. The mounting device of claim 1, wherein the body is made of polybutylene terephthalate.

4. A mount-capacitor assembly comprising:
a cylindrical capacitor with a cup having a cup bottom, and with a circumferential outer insulation; and
a mounting device comprising a hollow body defining a continuous through-hole that axially penetrates the body for receiving and mounting the capacitor, the body comprising a lower region having means for fastening the body to a connector element, and defining a lower through-hole portion having a cylindrical inside surface with a diameter; a middle region defining a middle through-hole portion having a cylindrical inside surface with a diameter that is smaller than the diameter of the lower through-hole portion, the cylindrical inside surfaces of the middle region and the lower region being bounded by a first inner shoulder between them, and an upper region defining an upper through-hole portion having a cylindrical inside surface with a diameter that is smaller than the diameter of the middle through-hole portion, the cylindrical inside surfaces of the upper region and the middle region being bounded by a second inner shoulder between them, the upper region being formed with resilient tongues which grip the cylindrical capacitor.

5. The mount-capacitor assembly of claim 4, wherein the cup bottom is planar.

6. The mount-capacitor assembly of claim 4, wherein the circumferential outer insulation is essentially flush with the cup bottom.

7. The mount-capacitor assembly of claim 4, wherein the circumferential outer insulation is formed with a first outer shoulder that abuts against the first inner shoulder.

8. The mount-capacitor assembly of claim 4, wherein the circumferential outer insulation is formed with a second outer shoulder that abuts the second inner shoulder to realize centering of the capacitor in the mounting device.

9. The mount-capacitor assembly of claim 4, wherein the capacitor is an aluminum electrolytic capacitor.

10. The mount-capacitor assembly of claim 4, further comprising:
a connector element connected to the mounting device by the fastening means, and a plate sandwiched between the cup bottom and the connector element for ensuring a sufficient creepage distance.

11. The mount-capacitor assembly of claim 10, wherein the plate is made of metal to realize suitable heat dissipation, the cup bottom being in flush contact with the plate.

12. The mount-capacitor assembly of claim 10, wherein the plate covers entire contact surfaces between the cup bottom and the connector element and between the mounting device and the connector element.

13. The mount-capacitor assembly of claim 10, wherein the plate has a thickness of 10 mm to 16 mm.

14. The mount-capacitor assembly of claim 13, wherein the plate has a thickness of 11 mm to 15 mm.

15. The mount-capacitor assembly of claim 14, wherein the plate has a thickness of 12 mm to 14 mm.

16. The mount-capacitor assembly of claim 15, wherein the plate has a thickness of 12.7 mm to 13 mm.

17. The mount-capacitor assembly of claim 10, wherein the connector element is a heat sink.

\* \* \* \* \*